(12) United States Patent
Colinge et al.

(10) Patent No.: US 11,362,051 B2
(45) Date of Patent: Jun. 14, 2022

(54) RF SUBSTRATE WITH JUNCTIONS HAVING AN IMPROVED LAYOUT

(71) Applicant: COMMISSARIAT A L'ENERGIE ATOMIQUE ET AUX ENERGIES ALTERNATIVES, Paris (FR)

(72) Inventors: Jean-Pierre Colinge, Grenoble (FR); Louis Hutin, Grenoble (FR); Maxime Moulin, Grenoble (FR); Thibaud Fache, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/199,610

(22) Filed: Mar. 12, 2021

(65) Prior Publication Data

US 2021/0296266 A1  Sep. 23, 2021

(30) Foreign Application Priority Data

Mar. 18, 2020 (FR) ..................... 20 02630

(51) Int. Cl.
| | | |
|---|---|---|
| *H01L 23/66* | (2006.01) | |
| *H01L 21/762* | (2006.01) | |
| *H01L 27/12* | (2006.01) | |
| *H01L 23/14* | (2006.01) | |

(52) U.S. Cl.
CPC ........ *H01L 23/66* (2013.01); *H01L 21/76254* (2013.01); *H01L 23/147* (2013.01); *H01L 27/1203* (2013.01); *H01L 2223/6672* (2013.01); *H01L 2223/6677* (2013.01)

(58) Field of Classification Search
CPC . H01L 23/66; H01L 21/76254; H01L 23/147; H01L 27/1203; H01L 2223/6672; H01L 2223/6677; H01L 23/58; H01L 23/52
USPC .................. 257/347, 728; 438/149, 479, 517
See application file for complete search history.

(56) References Cited

U.S. PATENT DOCUMENTS

| | | |
|---|---|---|
| 2002/0190349 A1 | 12/2002 | Maeda et al. |
| 2004/0094822 A1 | 5/2004 | Yu |
| 2008/0020488 A1 | 1/2008 | Clevenger et al. |
| 2011/0133308 A1 | 6/2011 | Chan et al. |
| 2013/0320490 A1 | 12/2013 | Demircan et al. |
| 2015/0171087 A1* | 6/2015 | Wu et al. ............ H01L 27/0928 257/369 |

FOREIGN PATENT DOCUMENTS

FR    2 808 122 A1    10/2001

OTHER PUBLICATIONS

French Preliminary Search Report dated Nov. 6, 2020 in French Application 20 02630 filed on Mar. 18, 2020 (with English Translation of Categories of Cited Documents), 2 pages.

(Continued)

*Primary Examiner* — Thinh T Nguyen
(74) *Attorney, Agent, or Firm* — Oblon, McClelland, Maier & Neustadt, L.L.P.

(57) ABSTRACT

Making a semiconductor-on-insulator substrate provided with an eddy current blocking structure (20) formed in a segment (22) doped according to doping of a first type, of doped regions (23) periodically distributed on one or more parallel rows and according to a pattern ($M_2$) and an improved arrangement.

17 Claims, 13 Drawing Sheets

(56) References Cited

OTHER PUBLICATIONS

Rack et al., "Low-Loss Si-Substrates Enhanced Using Buried PN Junctions for RF Applications", IEEE Electron Device Letters, vol. 40, No. 5, May 2019, pp. 690-693.
Rack et al., "Silicon-substrate enhancement technique enabling high quality integrated RF passives", IEEE/MTT-S International Microwave Symposium, 2019, pp. 1295-1298.

* cited by examiner

RF SUBSTRATE WITH JUNCTIONS HAVING AN IMPROVED LAYOUT

FIELD OF TECHNOLOGY AND STATE OF THE PRIOR ART

The present application relates to the field of semiconductor substrates and in particular those for radio frequency (RF) applications.

A semiconductor-on-insulator substrate is commonly formed by a support layer covered by, and in contact with, an insulating layer, itself covered with, and in contact with, a surface semiconductor layer usually for being used as an active layer, that is, in which at least part of electronic components such as transistors is to be formed.

For radio frequency applications, adaptations of such a substrate can prove necessary. Parasitic fields are indeed likely to disturb the operation of the substrate, in particular when high frequencies, for example above 5 GHz, are used.

A known improvement of these substrates consists in forming a so-called "trap rich" layer under and against the insulating layer, commonly called "BOX", that is formed by a semiconductor material rich in crystalline defects and which allows charges to be trapped.

With such a layer, parasitic conduction in the proximity of the insulating layer is limited, thereby improving the performance of radio frequency circuits in terms of radio frequency isolation, reduction of insertion losses and signal integrity.

Another way of limiting the flow of parasitic currents and in particular eddy currents under the insulating layer and in the proximity of the interface between this insulating layer and the semiconductor support layer is provided in document "Low-Loss Si-Substrates Enhanced Using Buried PN Junctions for RF Applications" by Rack et al, IEEE Electron Device Letters, Vol. 40, no. 5, p. 690, 2019.

In this document, alternating N-type doped strips 2 and p-type doped strips 4 are made in the support layer 6 of a semiconductor-on-insulator type substrate.

Such an arrangement type, illustrated in FIG. 1, allows junctions 1.1, 1.2, 1.3, 1.4, 1.5 to be formed, for stopping eddy currents flowing perpendicular to a main direction of elongation of the parallel N- and P-doped strips 2, 4.

In the example illustrated, the conductive circuit likely to originate eddy currents is in the form of a simple metal line 8 parallel to the N- and P-doped strips.

However, such an arrangement of junctions is not adapted to a case where the RF circuit takes a more complex form. Indeed, in the illustrated example, the junctions 1.1, 1.2, 1.3, 1.4, 1.5 would not allow eddy currents to be blocked in a direction parallel to the main direction of elongation of the lines. It is therefore necessary to place the metal line 8 in a single disposition on the support 6, that is, perpendicular to the doped strips 2 and 4.

The problem arises of making a new structure which is improved with respect to the above-mentioned drawback(s).

DISCLOSURE OF THE INVENTION

According to an embodiment, the present invention provides a semiconductor-on-insulator type substrate with a surface semiconductor layer disposed on an insulating layer, the insulating layer being arranged on support layer based on semiconductor material, said support layer being provided with a current blocking structure formed by a plurality of junctions for blocking the flow of parasitic currents in a plane parallel to a main plane of the support layer, said structure comprising, in a segment doped according to a doping of a first type, in particular P or N, a plurality of distinct doped regions having a doping of a second type, in particular N or P, opposite to said first type, said doped regions being entirely surrounded by a zone of said doped segment and with doping of the first type, said regions forming a given pattern comprising at least one first branch and at least one second branch making a non-zero angle with said first branch, the given pattern and the distribution of said doped regions in said doped segment being provided so that:

in a first direction parallel to the first axis and passing through said structure, said structure comprises one or more first junctions, in a second direction orthogonal to the first direction and passing through said structure, said structure comprises one or more second junctions, in at least a third direction making a non-zero angle with said first direction and second direction and passing through said structure, said structure comprises one or more third junctions.

Such a structure allows parasitic currents to be stopped in several directions while being adapted to different shapes of RF components or RF circuits or conductive elements conveying an RF signal.

It can advantageously be made without necessarily having to provide for precise alignment of said respective patterns of said regions with respect to the conductive track(s) forming an RF component or RF circuit likely to originate parasitic currents.

Advantageously, the structure includes in the first direction and/or in the second direction, and/or in the third direction:

a succession of doped regions forming said same given pattern identical in terms of shape and/or dimensions.

Typically, the distinct doped regions can be periodically distributed in said structure on one or more first rows parallel to a first axis, the first axis being parallel to the main plane of the substrate.

Advantageously, the distinct doped regions are periodically distributed in said structure on one or more other rows arranged parallel to a second axis, the second axis being parallel to the main plane of the substrate, the second axis making a non-zero angle with said first axis.

Preferably, the distinct doped regions are periodically distributed in said structure on one or more rows parallel to a first axis.

In particular, there can be a matrix arrangement of said doped regions, in which case said given pattern is repeated according to a matrix arrangement.

Preferably, the given pattern and distribution of the doped regions are provided in such a way that, whatever the given axis parallel to the first direction or to the second direction or to the third direction and passing between two said doped regions, this given axis passes through a succession of junctions. This optimally limits the possibility of creating conductive paths for parasitic currents.

Advantageously, the given pattern has a maximum dimension provided smaller and typically at least twice smaller, preferably at least ten times smaller, than a predetermined dimension equal to a maximum eddy current propagation length in said semiconductor material of the support layer at an operating frequency of an RF circuit that is capable of being disposed facing the blocking structure.

According to a possible implementation, the first row or rows are formed by a succession of doped regions including alternately said given pattern in a first orientation and said given pattern in a second orientation distinct from the first orientation.

The blocking structure can advantageously comprise several other rows parallel to the second axis, at least one given row among said other rows being formed by a repetition of said given pattern in the first orientation and at least one neighbouring row of the given row being formed by a repetition of said given pattern in said second orientation.

Advantageously, the given pattern can comprise a first branch and a second branch making a non-zero angle with the first branch, in particular orthogonal to the first branch.

According to a second possible arrangement in which said distinct doped regions are periodically distributed in said structure on one or more other rows parallel to a second axis, the first axis and said second axis being axes parallel to said main plane, said second axis making an angle of less than 90° with said first axis, among said first rows at least one given row being formed by a first succession of doped regions replicating said given pattern, at least one neighbouring row of said given row being formed by a second succession of doped regions replicating said given pattern, said neighbouring row being offset from said given row with respect to a plane orthogonal to the first axis and to said main plane.

According to another possible implementation of the given pattern, the latter can comprise a first branch, a second branch at a first end of the first branch and making a non-zero angle with the first branch, and a third branch at a second end of the first branch and making a non-zero angle with the first branch, the second branch and the third branch having respective different orientations in a plane parallel to a main plane of the support layer.

According to another possible implementation of the given pattern, the latter comprises a first main branch, a second main branch, a third main branch, a fourth main branch, said main branches meeting at an intersection region, the pattern further comprising secondary branches each connected to a main branch, the secondary branches having respective different orientations in a plane parallel to a main plane of the support layer.

According to another possible implementation of the given pattern, the latter is formed by a succession of branches of different respective orientations and making a spiral.

According to a particularly advantageous embodiment, the structure comprises, in the first direction, in the second direction, in the third direction:
a succession of doped regions forming said same given pattern identical in terms of shape, dimensions, and orientation with respect to a given direction among said first direction, second direction, third direction.

According to another aspect, the present invention relates to a microelectronic device comprising:
a substrate as defined above,
one or more electronic components, in particular one or more transistors at least partially formed in said surface layer of said substrate,
at least one RF conductive circuit or an RF component, said RF circuit or component being arranged facing said doped segment.

Typically, the RF component is an antenna and/or an inductor.

Advantageously, the given pattern has a maximum dimension measured parallel to the main plane of the substrate, provided smaller and typically at least twice smaller, advantageously at least ten times smaller than a predetermined dimension equal to the propagation length of eddy current in said semiconductor material of the support layer at said operating frequency.

According to another aspect, the present invention relates to a method for manufacturing a substrate, the method comprising the following steps of:
performing a doping of a first type of at least one segment of a semiconductor support,
disposing a mask facing said doped segment, the mask comprising openings having a shape replicating said given pattern,
implanting regions of said doped segment using a dopant species so as to perform a doping of a second type opposite to the first type.

The method can also comprise, after said implantation of regions, steps of:
forming an insulating layer on the semiconductor support, and then,
bonding a support provided with a semiconductor layer to the support,
removing a sacrificial portion from the substrate, while the semiconductor layer is retained and forms said surface semiconductor layer.

According to another aspect, the present invention relates to a method for making an RF device as defined above and comprising the steps of:
providing a semiconductor-on-insulator substrate as defined above and then,
forming said RF conductor circuit or said RF component facing said doped segment.

BRIEF DESCRIPTION OF THE DRAWINGS

The present invention will be better understood based on the following description and the appended drawings in which.

Figure 1:
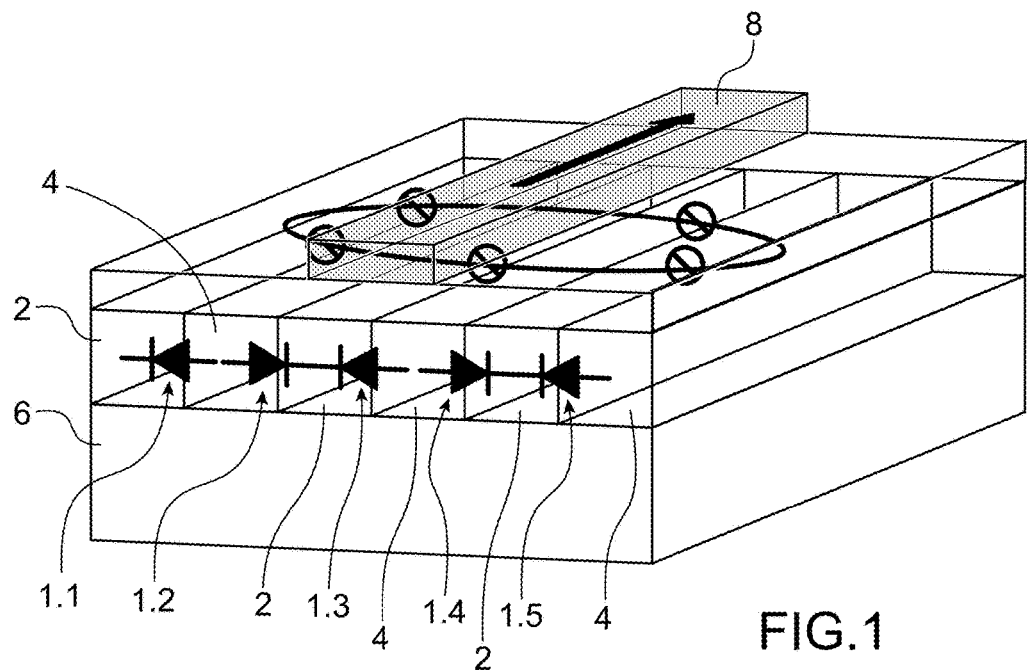
FIG. 1 is used to illustrate an 501 substrate with an eddy current blocking structure in the form of alternating parallel N- and P-doped strips°.

Identical, similar or equivalent parts of the various figures bear the same numerical references so as to facilitate switching from one figure to another.

The different parts represented in the figures are not necessarily to a uniform scale, to make the figures more legible.

DETAILED DISCLOSURE OF PARTICULAR EMBODIMENTS

An exemplary embodiment of a structure for blocking parasitic currents, in particular eddy currents, in a substrate as implemented according to one embodiment of the present invention, will now be given in connection with FIGS. 2A-2B (giving a transverse cross-section view of the substrate with the blocking structure and a top view of this structure, respectively).

The structure is made in an upper part of a semiconductor support layer 10 of a substrate, for example of the semiconductor-on-insulator type. This structure is in the form of a doped volume 20 of the support layer 10 and is disposed against, and preferably in contact with, the insulating layer 11 of the substrate. The insulating layer 11 is arranged on the support layer 10 and separates this support layer 10 from a surface semiconductor layer 12 in which transistor channels can be provided.

In particular, the substrate can be of the SOI type ("Silicon-On-Insulator"), that is, with a surface semiconductor layer 12 of silicon.

For example, the surface semiconductor layer 12 can be provided with a thickness of between 4 nm and 50 nm. The insulating layer 11 is typically based on silicon oxide and can have a thickness of, for example, between 15 nm and 250 nm.

The semiconductor support layer 10 can also be made of silicon and comprise a layer of semiconductor material of high resistivity, for example greater than 1000 Ω cm, and advantageously greater than 5000 Ω cm, under the doped volume 20.

The doped volume 20 can in turn have a thickness $e_1$ (dimension measured parallel to the z axis of an orthogonal reference frame [O;x;y;z] indicated in the figures) of, for example, between 50 nm and 1 µm, advantageously between 100 nm and 500 nm.

The doped volume 20 is formed here by a segment 22 doped according to a doping of a first type, offering a first conductivity type for example of the P-type, and by a plurality of doped regions 23. In the blocking structure, a repetition of doped regions 23 distinct from one another is provided, making a same pattern $M_1$, $M'_1$ identical in terms of size and shape.

By "distinct" it is meant here regions which are not contiguous with each other or which do not touch each other, and which are surrounded by said segment 22. The doped regions 23 have a doping of a second type, offering a second conductivity type opposite to said first conductivity type, for example N-type. By N-type doping it is meant a doping that consists in setting up an excess of electrons, while by P-type doping it is meant a doping that consists in setting up an excess of holes. In this example, there are thereby a P-doped segment 22 and N-doped regions 23 which are surrounded by this segment 22.

The doped regions 23 are thus surrounded, preferably entirely surrounded, by portions of said doped segment 22 having an opposite type doping. The volume 20 thus comprises PN or NP junctions 25a, 25b each formed between, on the one hand, a zone of the segment 22 doped according to said doping of the first type and, on the other hand, one of said regions 23 doped according to the doping of the second type or conversely.

Figure 5:
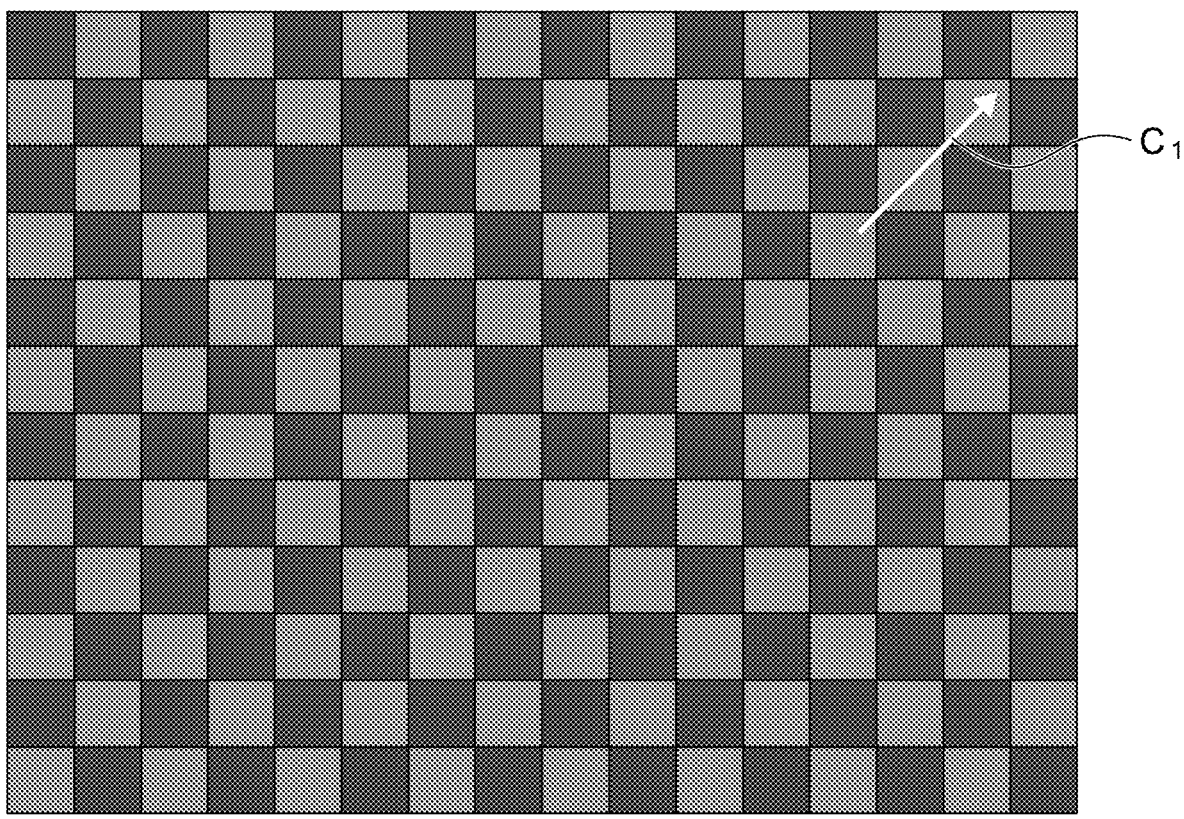
FIG. 5 is used to illustrate an alternative eddy current blocking structure in the form of a checkerboard arrangement of N- and P-doped zones°.

Such a disposition helps to limit or even prevent the propagation of parasitic eddy current of the type referenced $C_1$ in FIG. 5. In such a checkerboard arrangement illustrated in this FIG. 5, a parasitic current is indeed likely to pass through contiguous doped regions along a diagonal, with respect to the longitudinal and transverse rows of the checkerboard.

Figure 2A:
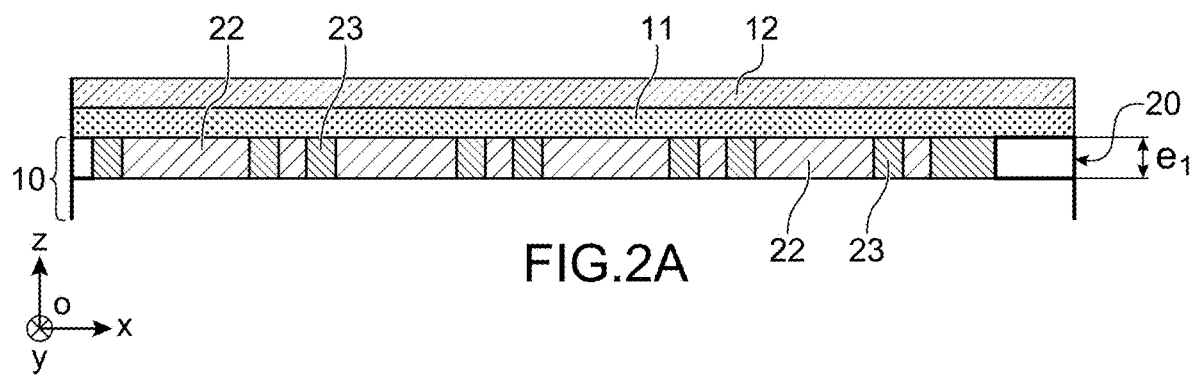
FIGS. 2A-2B are used to illustrate a semiconductor substrate with an eddy current blocking structure implemented according to a first exemplary embodiment of the present invention°.
Figure 2B:
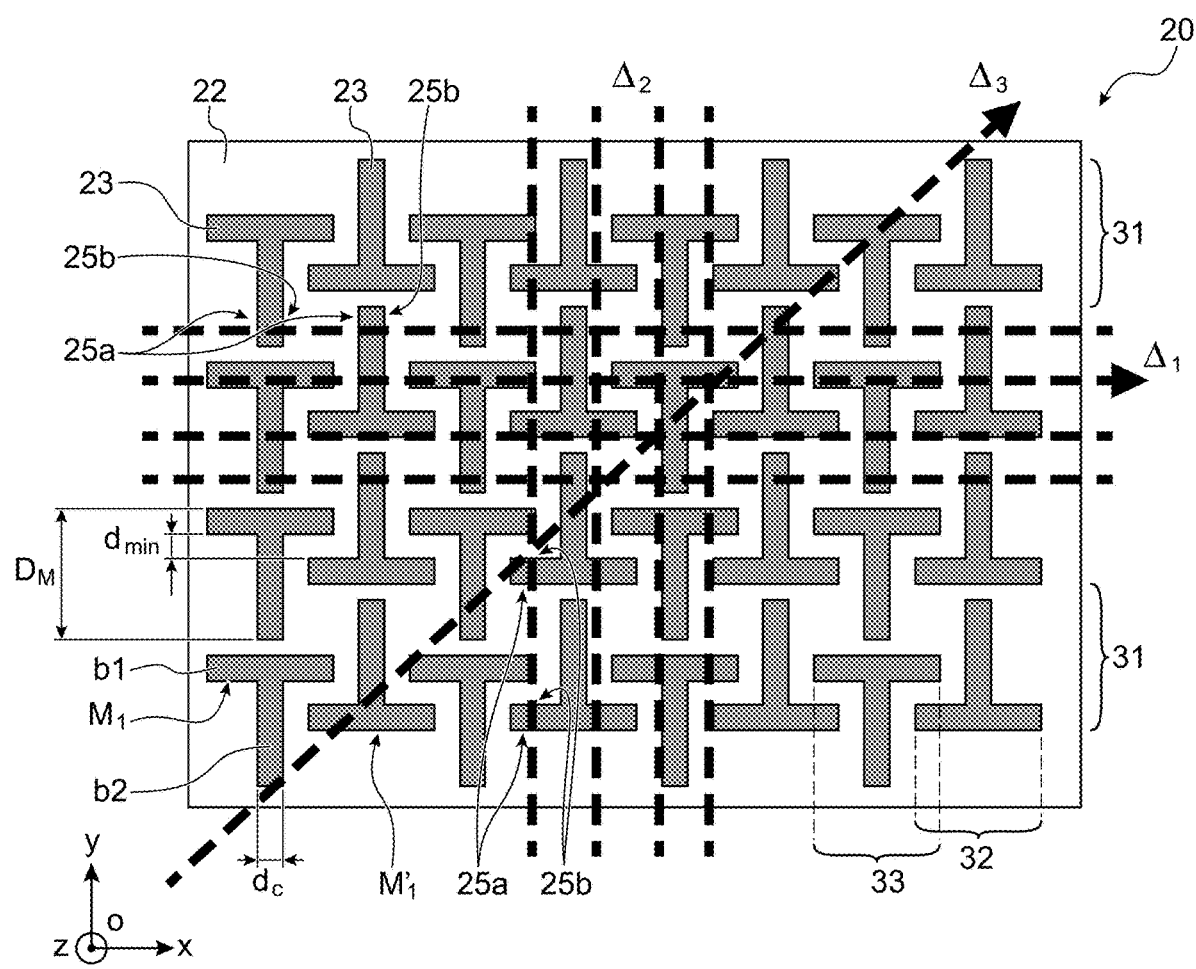

In the particular exemplary embodiment of FIGS. 2A-2B, the succession of doped patterns is such that the doped regions 23 are periodically distributed in the structure on at least one row 31, 32, 33. These regions 23 can themselves be disposed on several rows arranged parallel to a first axis $\Delta_1$, this axis $\Delta_1$ being parallel to a main plane of the substrate. By "main plane" of the substrate, it is meant here a plane passing through the substrate and which is parallel to the plane [O°;x°;y] given in the figures.

A matrix arrangement of doped regions 23 distributed in rows and columns can in particular be provided. Thus, in the particular exemplary embodiment illustrated, the doped regions 23 are also distributed in rows 31 parallel to a second axis $\Delta_2$, this second axis being in this example parallel to the main plane of the substrate and orthogonal to the first axis $\Delta_1$.

The periodical arrangement of the regions 23 is such that in a first direction parallel to the first axis $\Delta_1$, said structure includes one or more junctions 25a, 25b, allowing parasitic currents to be blocked in this first direction, while in a second direction orthogonal to the first direction and parallel to the second axis $\Delta_2$, said structure comprises one or more junctions 25a, 25b allowing parasitic currents to be blocked in this second direction, and that in at least a third direction parallel to a third axis $\Delta_3$ and making a non-zero angle, for example 45°, with said first and second directions and passing through said structure, said structure includes one or more junctions 25a, 25b allowing parasitic currents to be blocked in this third direction.

Insofar as the propagation length Ip of the eddy currents depends on the operating frequency of the RF circuit, the extent (in other words, footprint or occupied area) of the blocking structure or doped volume measured in a plane parallel to the main plane of the substrate is adapted as a function of that of the RF component, for example of the antenna or inductor type, and of that operating frequency. The extent of the blocking structure is thus preferably greater than that of the antenna and for example, for a 30 Ghz antenna, an overhang $L_D \geq lp$ of at least 1 mm, representing the maximum eddy current propagation lengths, is provided.

Preferably, the arrangement of the doped regions 23 and their size are also provided so that, facing the antenna, a segment with a length equal to said propagation length Ip is intersected by at least one PN junction and at least one NP junction.

For this, the maximum length of the doped regions 23, in other words, the maximum dimension $D_M$ of the patterns $M_1$, $M'_1$ measured in parallel to the plane [0;x;y] of the orthogonal reference frame [0;x;y;z] can be provided as a function of the dimension Ip and preferably such that $2*D_M \leq lp$. Typically, the maximum dimension $D_M$ is much smaller, that is, at least 10 times smaller than the dimensions of the antenna and the propagation length Ip.

Thus, a device provided with such a blocking structure has a large number of junctions allowing parasitic currents to be blocked in at least 3 different directions (for example a 45° difference).

Figure 6:
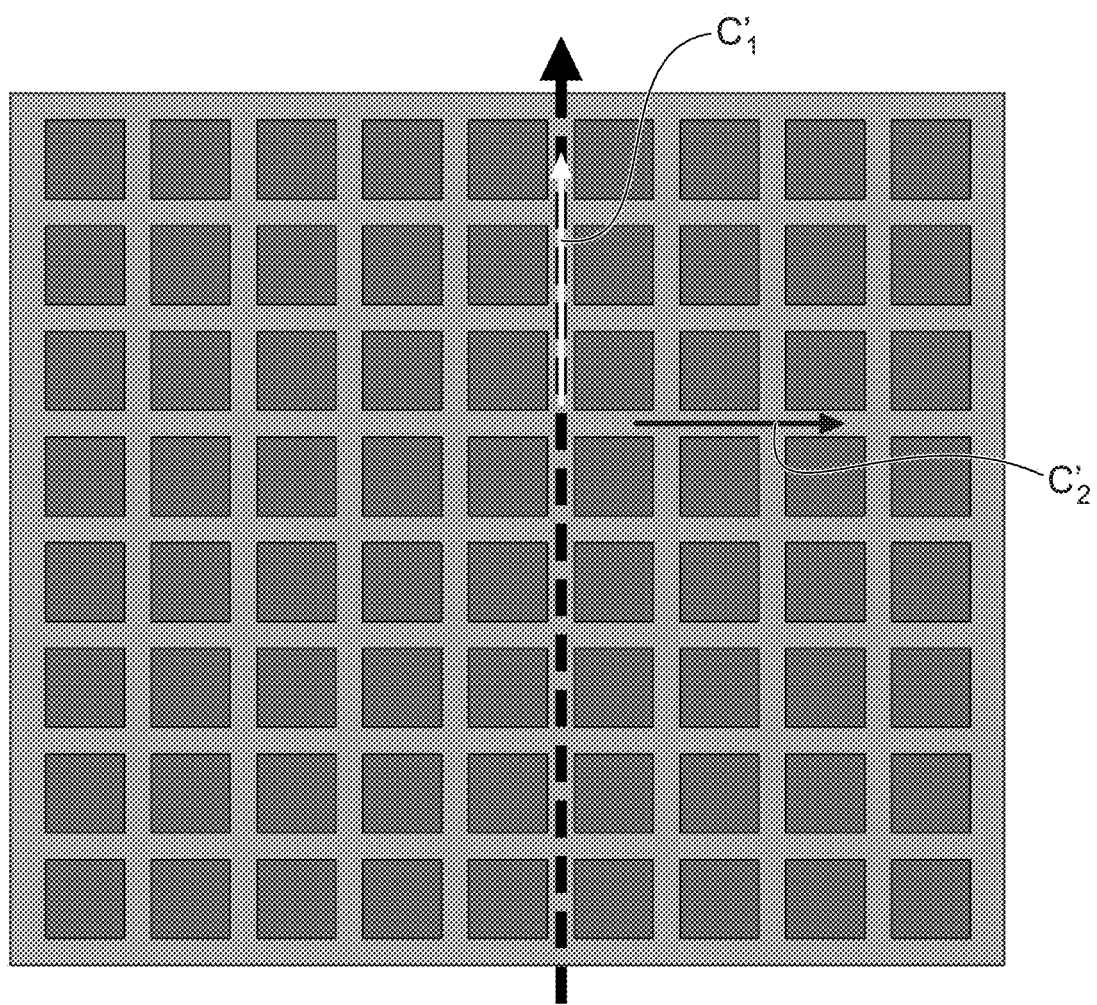
FIG. 6 is used to illustrate another alternative eddy current blocking structure in the form of a matrix arrangement of N-doped zones having a rectangular pattern and made inside an overall P-doped segment°.
Figure 7:
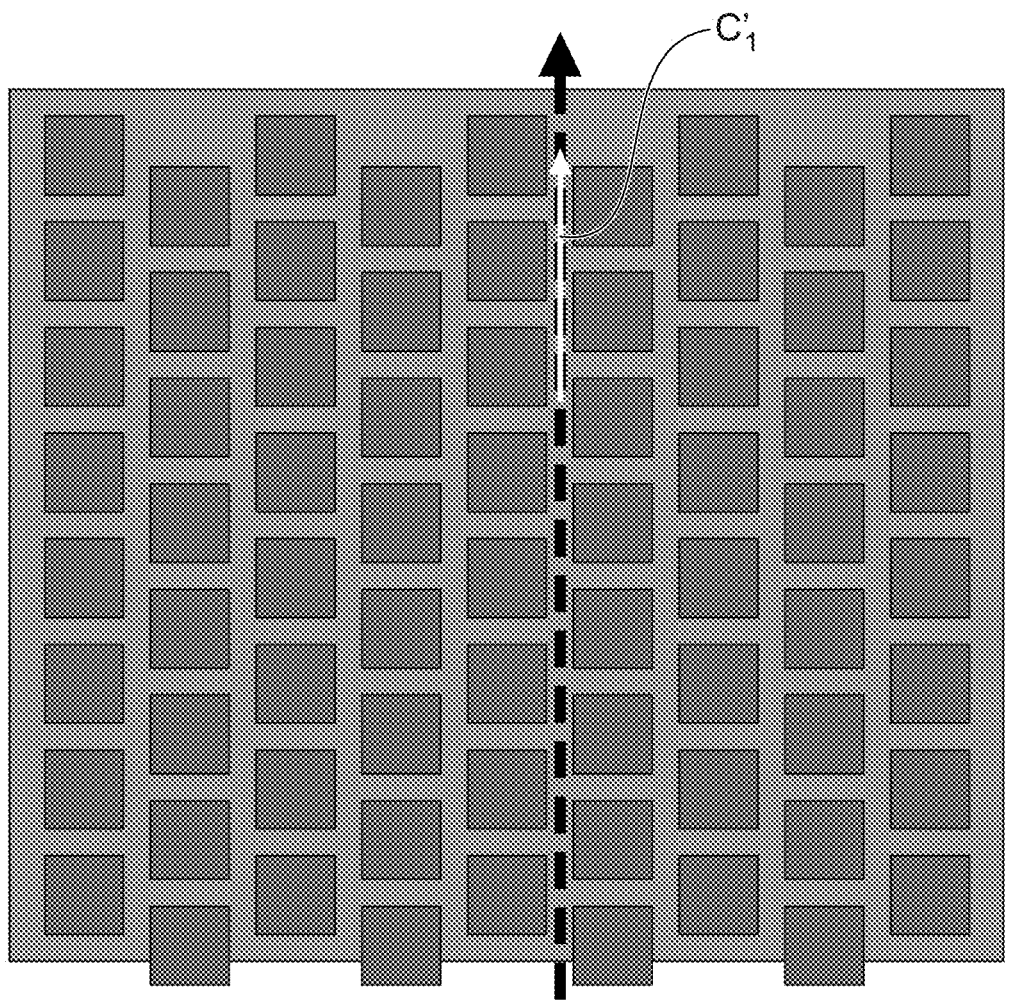
FIG. 7 is used to illustrate another alternative matrix arrangement of N-doped regions inside an overall P-doped segment°.

The N-type doped regions 23 preferably follow a same pattern $M_1$, $M'_1$. In the example illustrated, this pattern $M_1$, $M'_1$ is formed by at least one first branch $b_1$ and at least one second branch $b_2$ connected to the first branch $b_1$ and making a non-zero angle with the first branch $b_1$. This thus differs from rectangular or square patterns, such as those shown in FIGS. 6 and 7, which, in a checkerboard matrix arrangement, would favor the formation of parasitic current paths $C'_1$, $C'_2$. With such a pattern shape, the possibility of creating parasitic current paths is limited.

The first branch $b_1$ and/or the second branch $b_2$ of the pattern $M_1$, $M'_1$ can be provided with a critical dimension dc (dimension measured in parallel to the plane [O;x;y] corresponding to the smallest dimension of a pattern apart from its thickness) of, for example, between 500 nm and 10 μm, preferably between 1 μm and 5 μm.

For example, a maximum dimension $D_M$ of between 5 μm and 100 μm, advantageously between 25 μm and 50 μm, can be provided, while a minimum space $d_{min}$ of between 500 nm and 10 μm, advantageously between 1 μm and 5 μm, can be provided for tracks with a width between 500 nm and 10 μm.

The repetition and distribution in rows of the doped regions 23 according to a determined pattern or same sequence of patterns, allows an RF component or RF conductive circuit or a conductive element to be provided facing the doped volume 20 without necessarily having to perform a precise alignment of this component or this circuit or this conductive element with respect to the junctions and in particular to the boundaries of the doped regions 23. The blocking structure can thus be advantageously designed without necessarily knowing beforehand the exact design of the RF circuit or RF component to be made facing the doped volume 20. The dimensions of the tracks forming the RF circuit or component as well as the overall size of this component or circuit can then be sufficient.

In the particular exemplary embodiment illustrated in FIG. 2B, the pattern $M_1$, $M'_1$ replicated in a matrix arrangement is a 'T' shaped pattern, with rows 32 in which the pattern $M_1$ has a first orientation with respect to the axis $\Delta_1$ alternating with rows 33 in which the pattern $M'_1$ follows a second orientation, the patterns $M_1$, $M'_1$ of a row 32 being in this particular arrangement disposed head to tail, that is, with a rotation of 180°, with respect to those $M'_1$ of the neighboring row 33.

However, other arrangements and shapes of patterns can be provided. FIG. 2B illustrates an advantageous embodiment especially in relation to those illustrated in FIGS. 8 and 9, where other types of 'L'-shaped and single cross, or '+'-shaped patterns, or patterns consisting of four branches are used.

Figure 8:
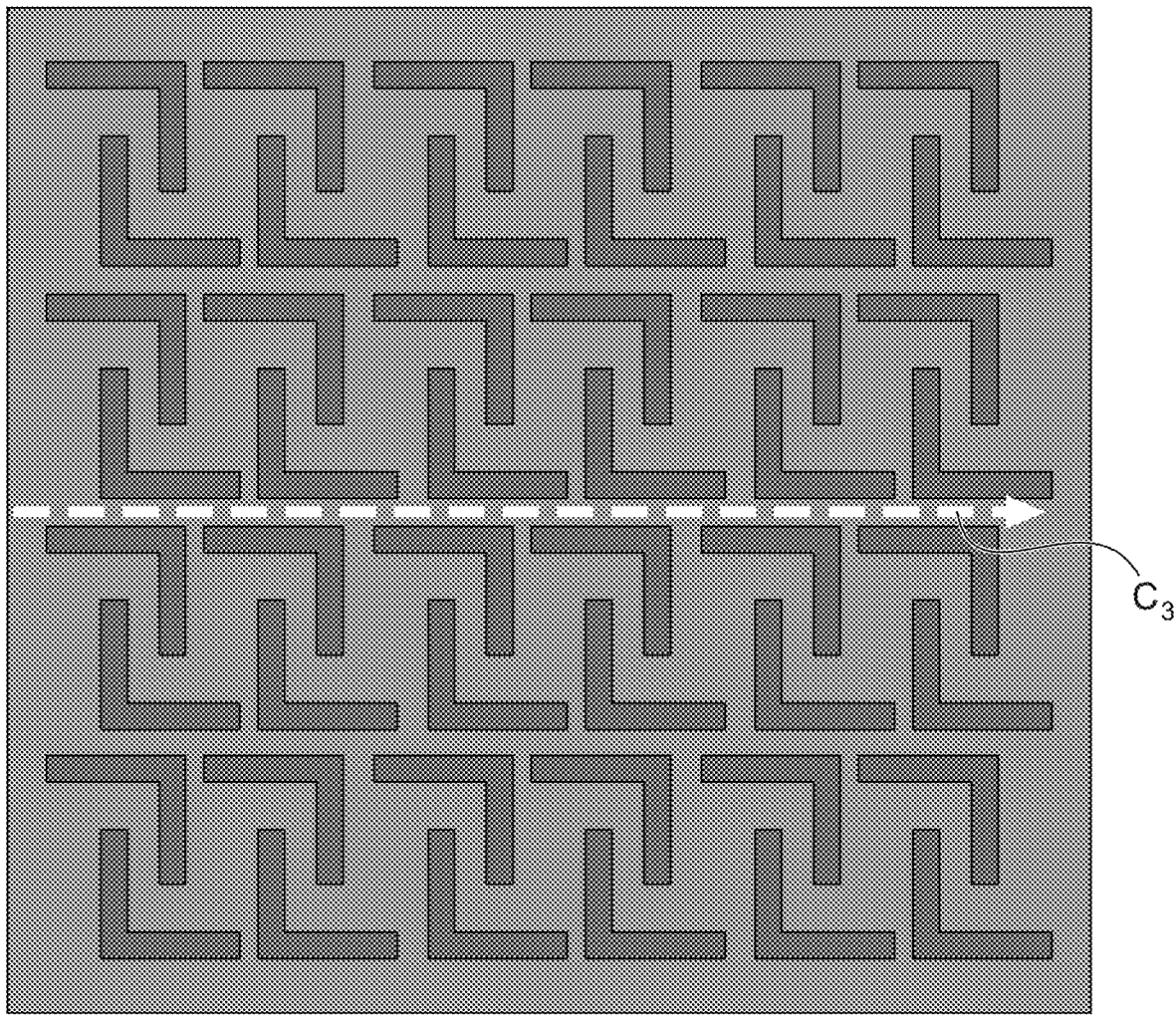
FIG. 8 is used to illustrate an arrangement of doped regions having a pattern formed by several branches and made inside an overall doped segment having a conductivity type opposite to that of said regions°.
Figure 9:
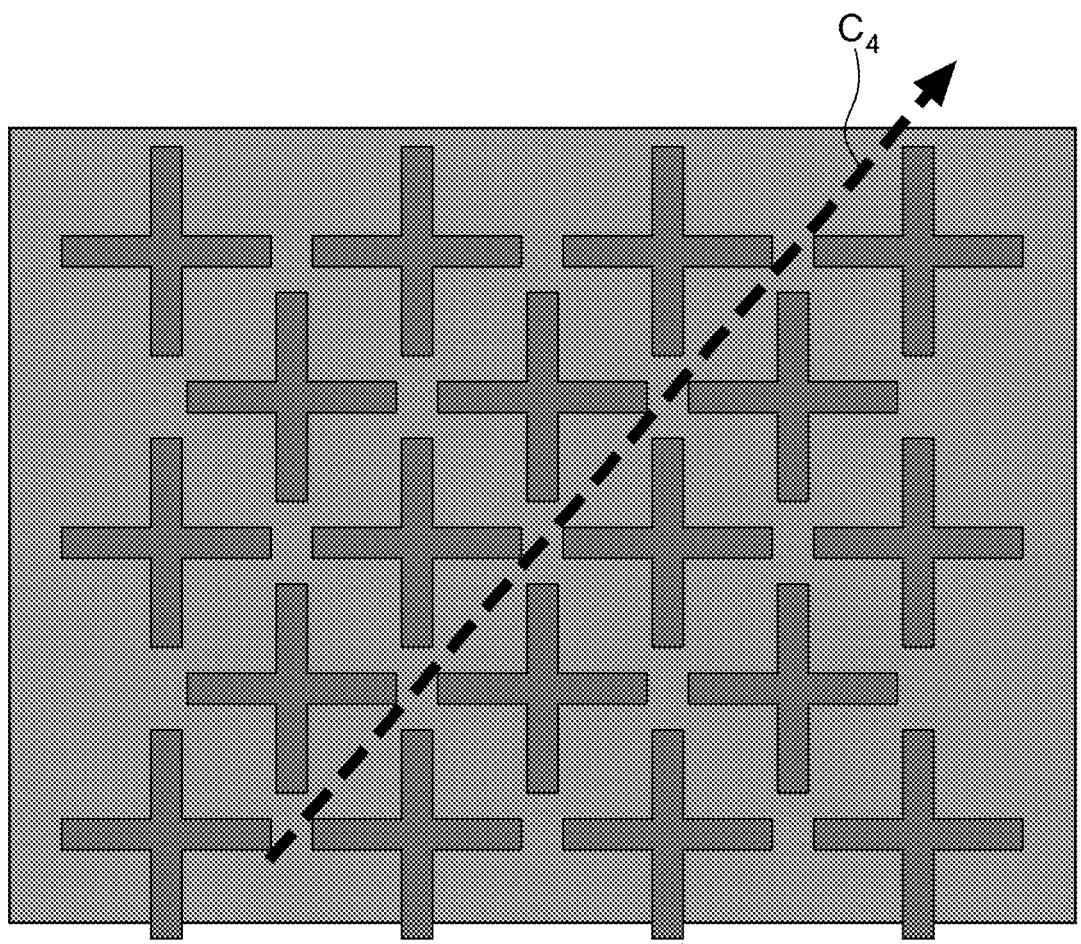
FIG. 9 is used to illustrate an arrangement of doped regions having a pattern formed by a several branches and made inside an overall doped segment having a conductivity type opposite to that of said regions°.

In the exemplary embodiment illustrated in FIG. 2B, the arrangement of the patterns $M_1$, $M'_1$ and their shape are determined so that whatever given axis parallel to the first axis $\Delta_1$, or to the second axis $\Delta_2$ or to the third axis $\Delta_3$ passing through the structure and passing through a zone of the segment 22 between two neighboring doped regions 23, this given axis encounters alternating N-type doped zones and P-type doped zone, with at least one PN junction and at least one NP junction. Parasitic conductive paths such as those $C_3$, $C_4$ schematically represented in FIGS. 8 and 9 are thus avoided.

Figure 3:
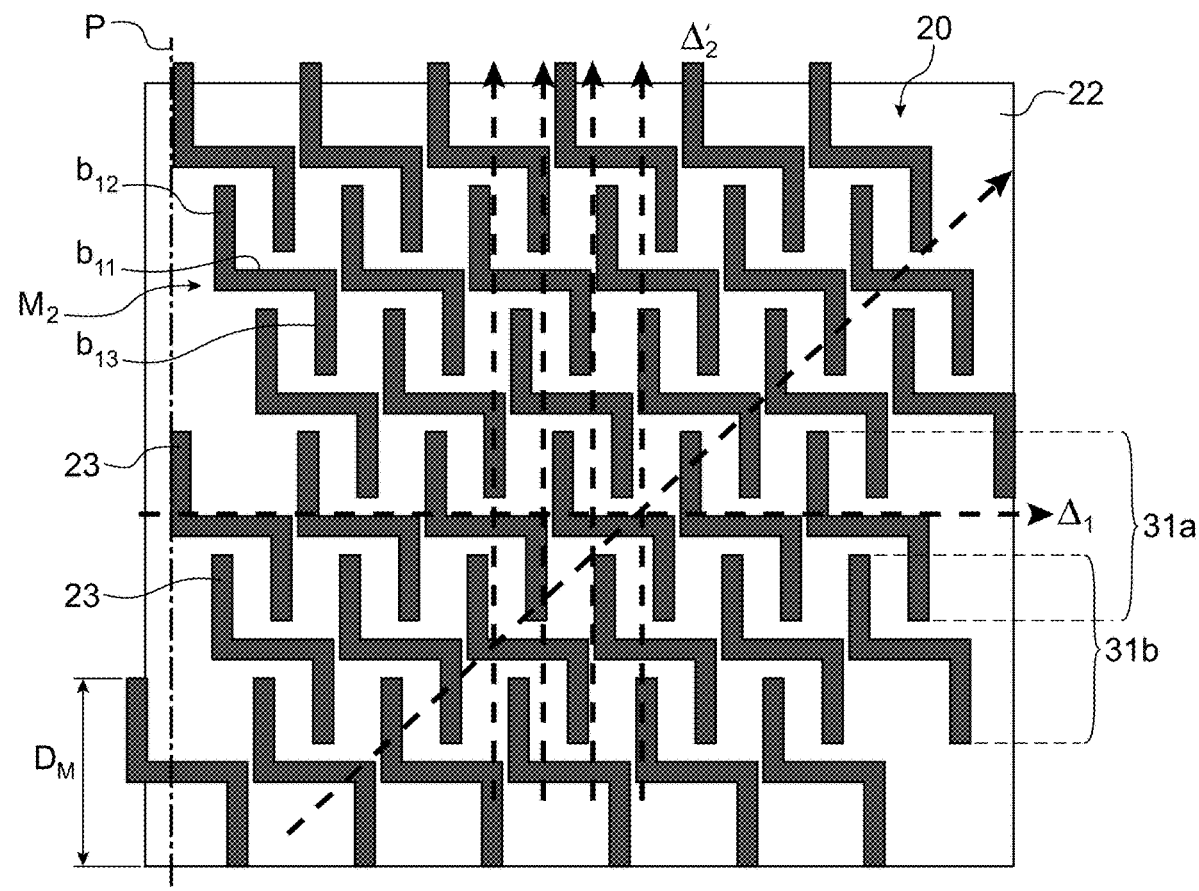
FIG. 3 is used to illustrate a second exemplary embodiment of the present invention°.

A second example of the blocking structure is shown in FIG. 3. It differs from the previously described example, especially in the shape of the doped regions 23, as well as in their distribution in the doped segment 22.

The doped regions 23 here have an identical pattern $M_2$ repeated, advantageously periodically, and preferably according to a matrix arrangement in which the pattern repetition is performed on several axes $\Delta_1$, $\Delta'_2$.

The pattern $M_2$ includes, in this particular example, a first branch $b_{11}$, a second branch $b_{12}$ located at a first end of the first branch $b_{11}$ and a third branch $b_{13}$ located at a second end of the first branch $b_{11}$. The branches $b_{12}$ and $b_{13}$ make a non-zero angle, for example 90° with the first branch $b_{11}$. According to the example illustrated, the second branch $b_{12}$ and the third branch $b_{13}$ have parallel elongation directions and in respective opposite senses. In other words, here the pattern $M_2$ is not U-shaped. Such a pattern $M_2$ with several branches extending in different directions (with respect to $b_{11}$) participates in implementing current blocking in several directions.

As in the previous example, a regular arrangement of the regions 23 in lines parallel to a first axis $\Delta_1$ is provided. However, in this particular exemplary embodiment, a positioning offset of the patterns is implemented between successive neighboring rows 31a, 31b parallel to the first axis $\Delta_1$. The offset between neighboring rows is here an offset taken with respect to a plane P orthogonal to the main plane of the substrate and orthogonal to the first axis $\Delta_1$.

Thus, a given row 31a formed by a succession of patterns $M_2$, is, with respect to an axis orthogonal to the first axis $\Delta_1$ offset with respect to a neighboring row of said given row formed by another succession of said same given pattern $M_2$. A distribution of the patterns $M_2$ in rows parallel to a second axis $\Delta'_2$ non-orthogonal to the first axis is here made.

Due to the shape and arrangement of the regions 23, in particular their distribution and periodic repetition, the parasitic current blocking structure can, as in the previous exemplary embodiment, be made without precise knowledge of the track arrangement of the RF circuit or the RF component. Furthermore, once again, blocking along at least 3 distinct directions is implemented, in particular at least 45° to each other.

Figure 4:
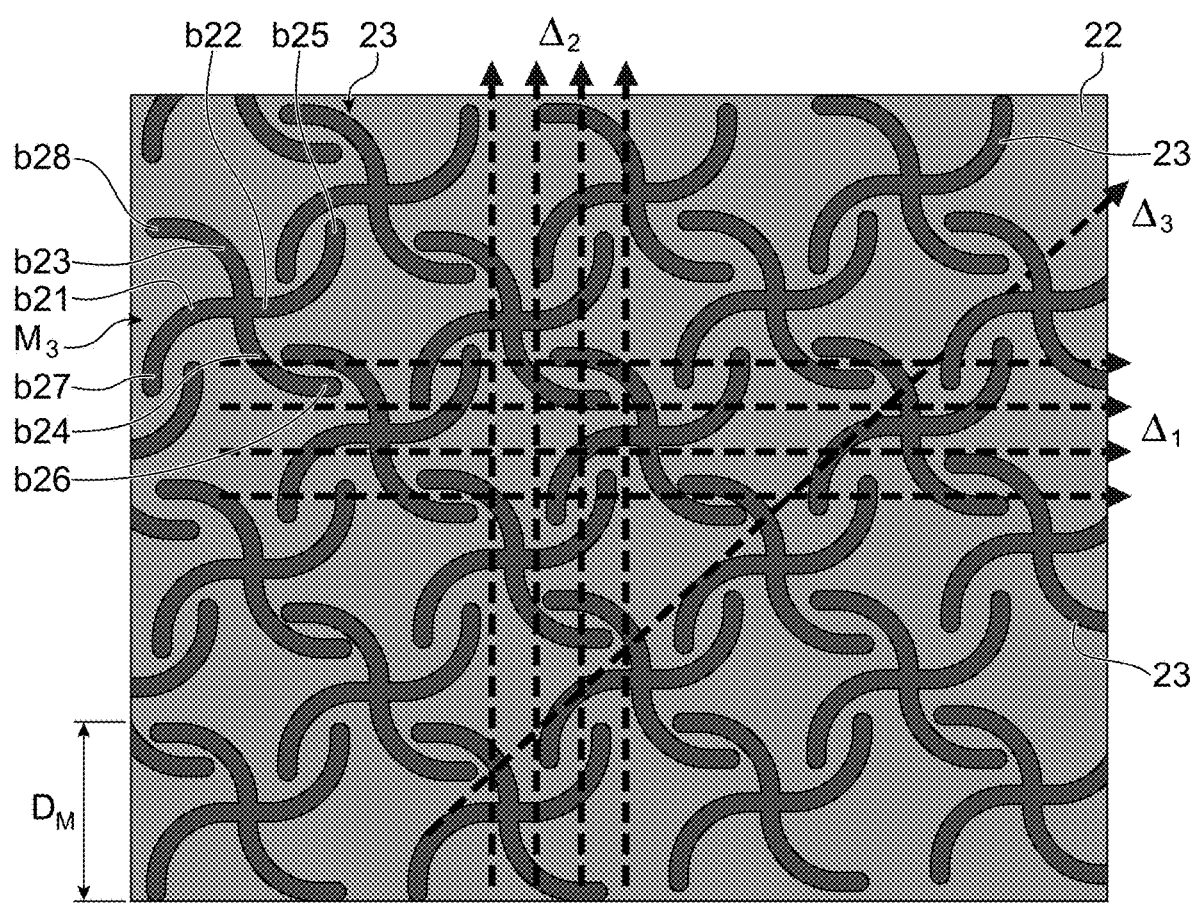
FIG. 4 is used to illustrate a third exemplary embodiment of the present invention°.

A third exemplary embodiment of a blocking structure is shown in FIG. 4. It differs from the previous example especially in the shape of the doped regions 23.

The doped regions 23 have here a pattern $M_3$ formed by four main branches $b_{21}$, $b_{22}$, $b_{23}$, $b_{24}$ meeting in an intersection region and four secondary branches $b_{25}$, $b_{26}$, $b_{27}$, $b_{28}$ each located at a respective end of a main branch $b_{21}$, $b_{22}$, $b_{23}$, $b_{24}$, the secondary branches $b_{25}$, $b_{26}$, $b_{27}$, $b_{28}$ following different respective orientations.

Such a pattern $M_3$ facilitates an arrangement in which branches of neighboring patterns interpenetrate to create zones in the doped segment 22 according to the doping of the first type and making a sinuous travel. This helps to limit or even prevent the flow of eddy currents.

In the exemplary embodiment illustrated in FIG. 4, the pattern has been represented without an angle, but those skilled in the art will be able to adapt this pattern with an angle, in particular a right angle, between a main branch and its secondary branch in order to make this pattern with lithography techniques currently available.

For example, the pattern $M_3$ is similar to that of a swastika but other patterns with main and secondary branches may be used. For example, a pattern can be seen, in which the main branches make an angle other than 90° with each other and/or in which the secondary branches $b_{25}$, $b_{26}$, $b_{27}$, $b_{28}$ make an angle other than 90° with the main branches and/or in which other so-called "tertiary" branches from the secondary branches make a non-zero angle with the latter.

As in the previously described example, the regular distribution according to a predetermined pitch of the pattern $M_3$ makes it possible to make a blocking structure allowing eddy current to be prevented from flowing without necessarily having to know in advance the disposition of the conductive tracks of an RF circuit or an RF component (such as an antenna) for being positioned facing the doped volume 20.

In either of the previously described embodiments, it is possible to make an N-doped segment 22 while the regions 23 located inside that segment 22 are P-doped. Conversely, a P-doped segment 22 can be made while the regions 23 integrated into that segment 22 are N-doped.

In the exemplary embodiment illustrated in FIG. 4 as in the other previously described exemplary embodiments, a blocking structure which comprises in the first direction, in the second direction, in the third direction: a succession of doped regions forming said same given pattern identical in terms of shape, dimensions, and possibly orientation with respect to a given direction among said first direction, second direction, third direction is particularly advantageous. Optimal blocking is performed while avoiding the problem of alignment with a passive component or an antenna. According to one embodiment, a blocking structure comprises in the first direction, in the second direction, in the third direction: a succession of doped regions forming said same given pattern identical in terms of shape, dimensions, and orientation with respect to a given direction among said first direction, second direction, said third direction.

Figure 15:
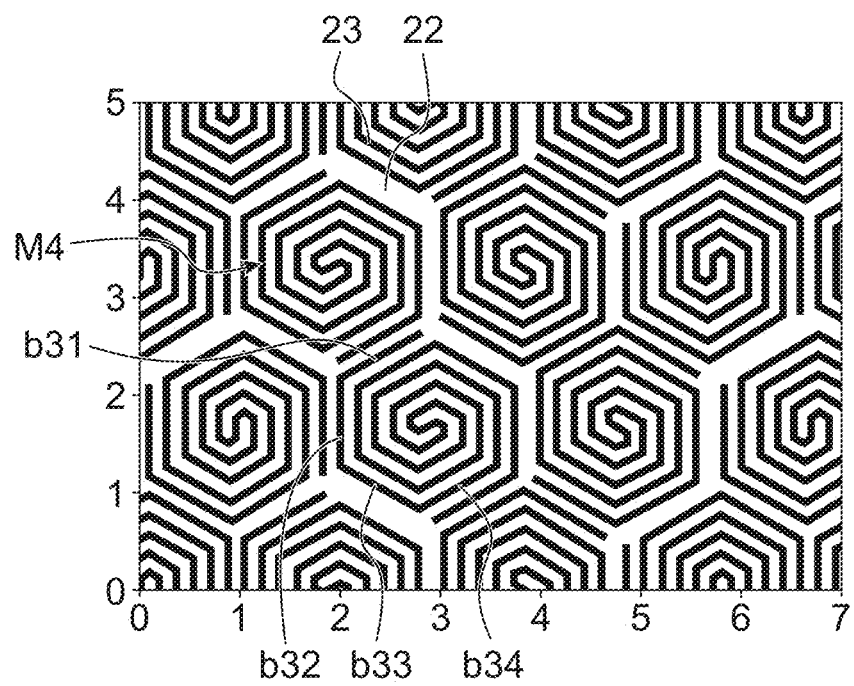
FIG. 15 is used to illustrate an arrangement of doped regions formed by several branches making a spiral pattern inside an overall doped segment having a doping type opposite to that of said regions°.

Another exemplary embodiment of a blocking structure is shown in FIG. 15. It differs in the shape of the doped regions 23. Here, the doped regions 23 form a spiral-shaped $M_4$ pattern comprised of a succession of distinct branches $b_{31}$, $b_{32}$, $b_{33}$, $b_{34}$, etc. with orientations different from each other. The branches here in the form of turns do not touch each other, nor from one pattern $M_4$ to another. The branches can have a critical dimension, for example, in the order of 100 nm, the spiral pattern having a maximum dimension, for example, in the order of 1.5 µm, much smaller than that of a passive component of the inductor or antenna type.

Figure 10:
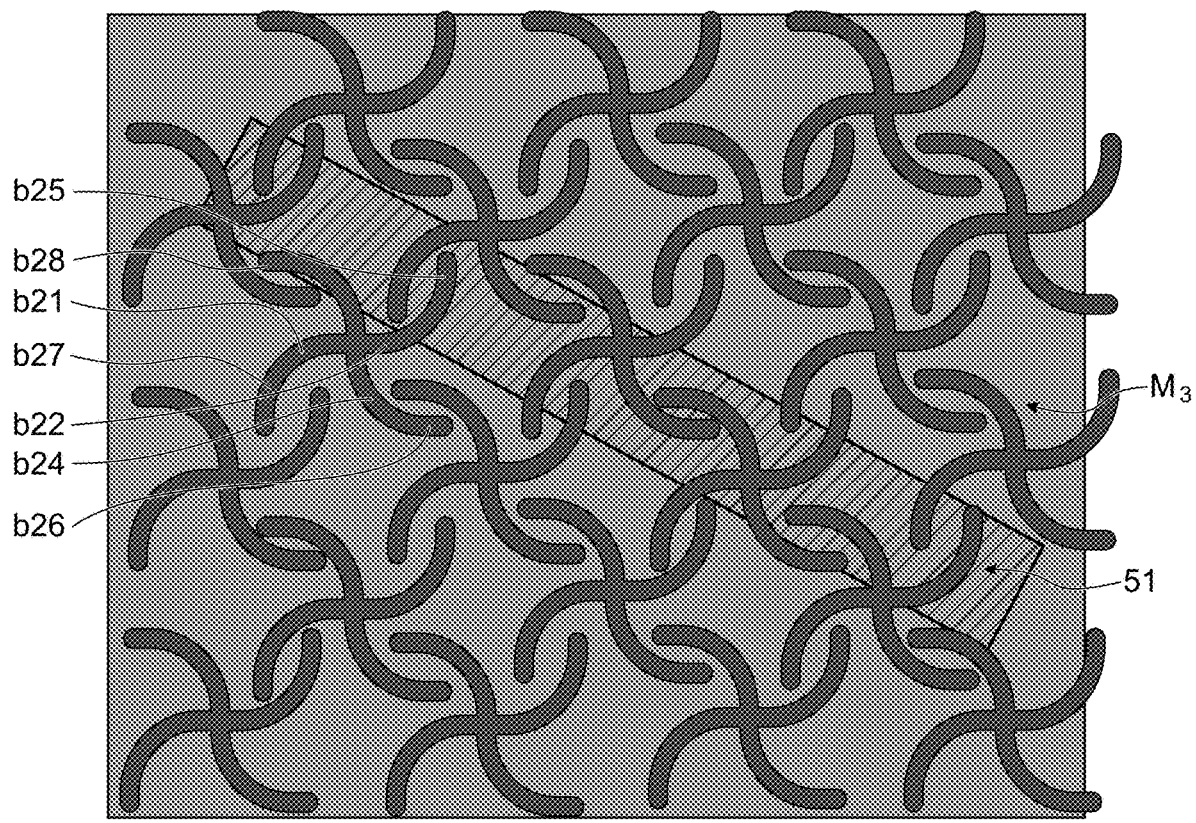
FIG. 10 is used to illustrate an exemplary embodiment of an eddy current blocking structure according to the present invention, with an antenna or inductor portion facing said structure°.

In the exemplary arrangement illustrated in FIG. 10 (showing a top view), a conductive track 51 of, for example, an antenna or inductor, through which an RF signal is to flow, is positioned above and facing the doped volume 20 in which the repeated succession of PN and/or NP junctions is made. This conductive track 51 can be positioned without necessarily being aligned with and/or without taking account of the orientation of either of the branches $b_{21}$, $b_{22}$, $b_{23}$, $b_{24}$, $b_{25}$, $b_{26}$, $b_{27}$, $b_{28}$ of the pattern or patterns $M_3$ of the blocking structure.

Figure 11A:
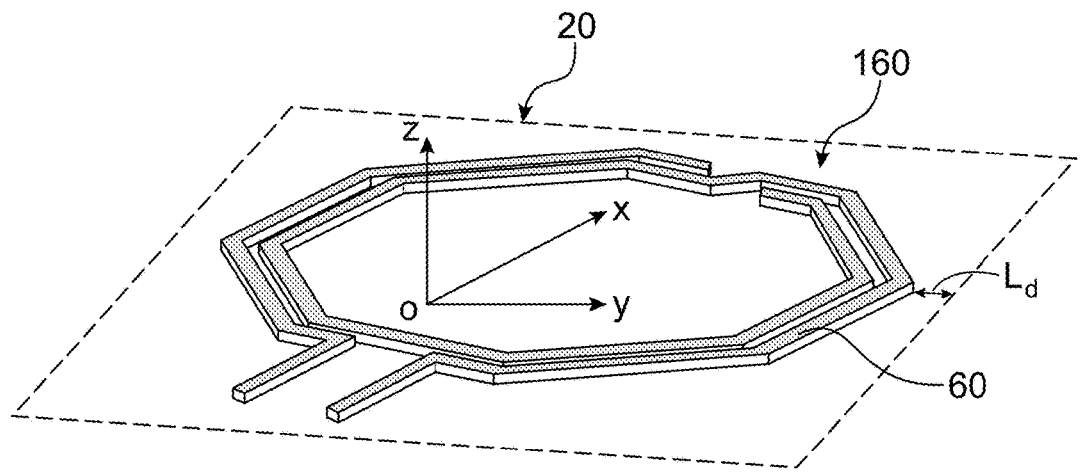
FIGS. 11A-11B are used to illustrate examples of RF components for being placed facing an eddy current blocking structure as implemented according to the invention°.
Figure 11B:
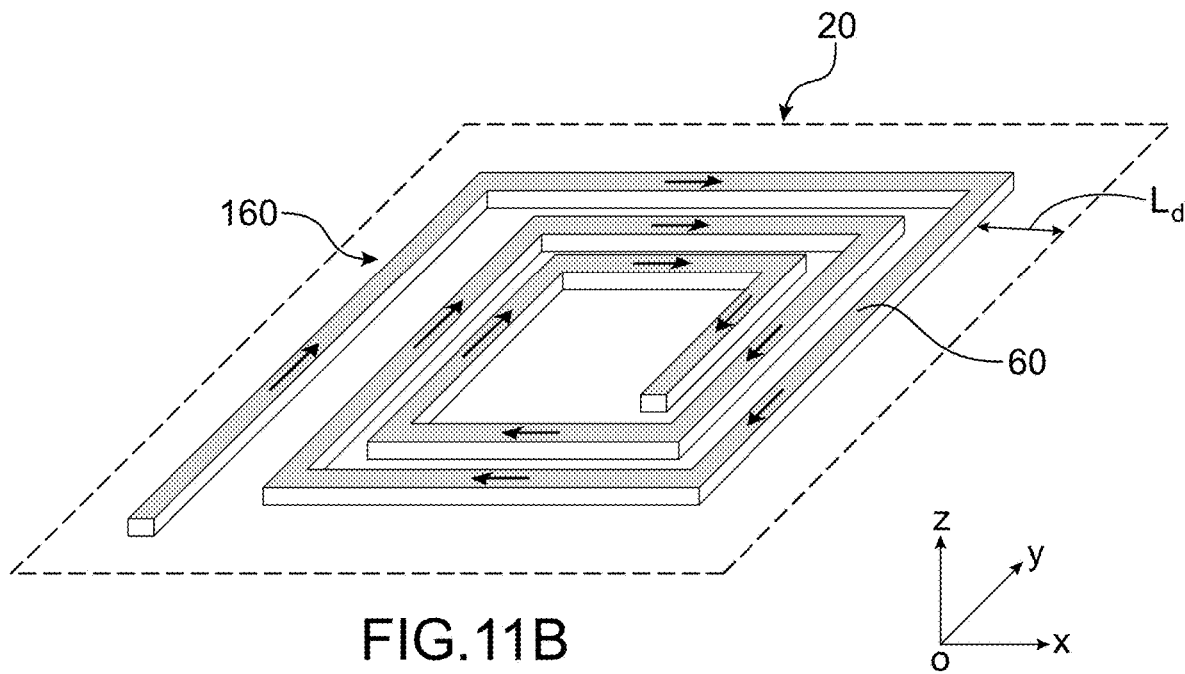

For example, the conductive track 51 can be an inductor portion 160 making a polygon-shaped loop as illustrated in FIG. 11A or an overall rectangular loop in FIG. 11B. In this case, knowledge of the area occupied by the inductor 160 and the track width 60 allows the blocking structure 20 to be made without necessarily knowing the orientation of the conductive tracks with respect to the doped patterns.

An exemplary embodiment of a parasitic current blocking structure for a semiconductor-on-insulator substrate, which can be of the type of one of the previously described embodiments, will now be given in connection with FIGS. 12A-12C.

A possible starting material for this process is here a bulk substrate, that is, of the type formed by a wafer of semiconductor material. The bulk substrate is here to form the support layer in which the blocking structure is made.

Figure 12A:
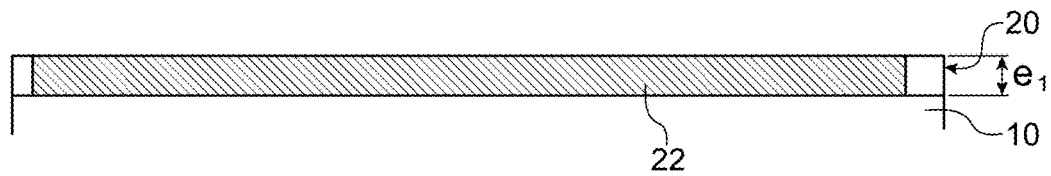
FIGS. 12A, 12B, 12C are used to illustrate a method for manufacturing a semiconductor-on-insulator substrate provided with an eddy current blocking structure as implemented according to one embodiment of the present invention°.
Figure 12B:
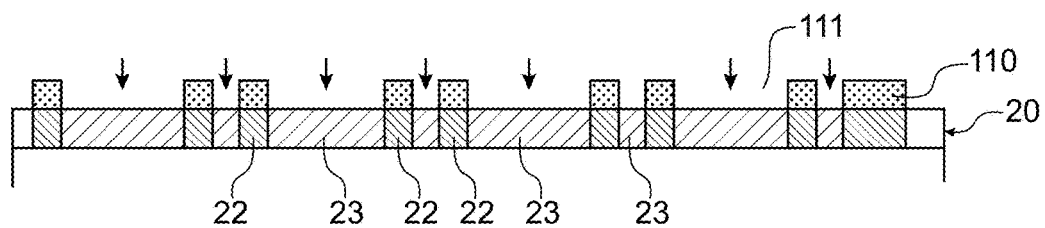
Figure 12C:
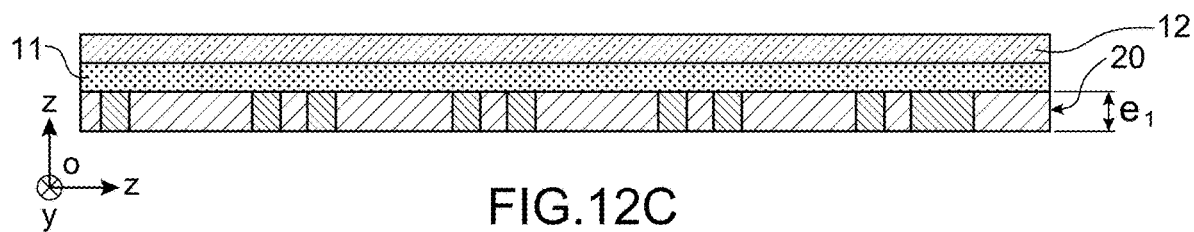
Figure 13:
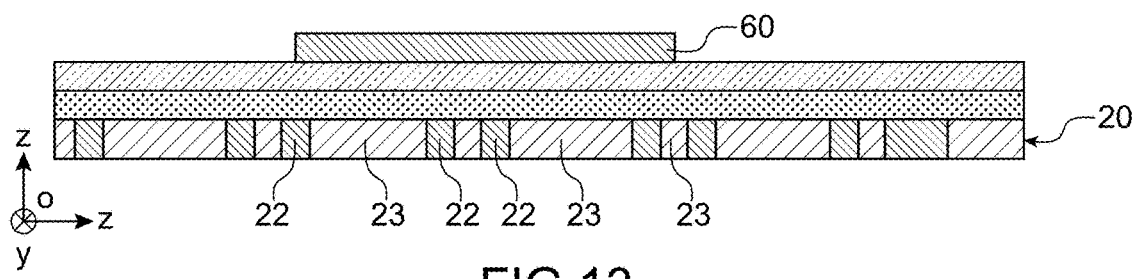
FIG. 13 is used to illustrate a microelectronic device having a semiconductor-on-insulator substrate provided with an eddy current blocking structure in the support layer and facing which an RF component or circuit is formed°.

A surface layer of this support layer 10 can first be doped, for example by implantation, to make the doped segment 22 (FIG. 12A). For this purpose, a doping of a first type is carried out so as to form a doped segment 22. For example, if a doping with an acceptor species is performed, a segment 22 having a P-type doping is made.

To form a P-doped segment 22 in the support layer 10, a boron implantation can for example be performed with an energy of, for example, between 10 keV and 150 keV, and a dose of, for example, between $10^{14}$ cm$^{-2}$ and $10^{15}$ cm$^{-2}$.

Next, an implantation mask 110 is provided comprising distinct openings 111 each replicating a given pattern, for example one of the patterns $M_1$, $M_2$, $M_3$ previously described. The mask 110 can, for example, be based on resin in which the openings 111 are provided, for example by means of a photolithography process.

The doped regions 23 are then formed according to a doping of the opposite type. For example, if implantation is performed with a donor species through the openings 111 in the mask 110, regions 23 having an N-type doping can be made (FIG. 12B) in parts exposed by the openings 111.

In order to make N-doped regions 23 in the P-doped segment 22, a phosphorus implantation can for example be performed with an energy of, for example, between 20 keV and 200 keV, and a dose of, for example, between $10^{14}$ cm$^{-2}$ and $10^{15}$ cm$^{-2}$.

According to another exemplary embodiment, arsenic implantation with an energy of, for example, between 40 keV and 200 keV, and a dose of, for example, between $10^{14}$ cm$^{-2}$ and $10^{15}$ cm$^{-2}$ can be performed to form the regions 23.

The dose used to form the doped regions 23 is preferably greater than that of the doped segment 22, in order to be able to locally reverse the conductivity type in the doped regions 23 and to be able to create P-doped regions in an overall N-doped segment or conversely N-doped regions in an overall P-doped segment.

The mask 110 can then be removed. For example, in a case where the mask 110 is based on a photosensitive resin, the mask 110 can be removed by etching using oxygen plasma and/or a bath containing a mixture of sulphuric acid and hydrogen peroxide. Advantageously, a "hard" mask, for example of silicon oxide or nitride, previously etched by photolithography and etching, for example by plasma, can be used. The hard mask can then be removed chemically, using an HF solution for an oxide mask or $H_3PO_4$ for a nitride mask.

An insulating layer 11 can then be formed on the support layer 10, for example by silicon oxide deposition.

A semiconductor layer 12 for forming the surface layer of the semiconductor-on-insulator substrate is then transferred. This surface layer can be made, for example, by transferring a handle semiconductor support, for example of silicon, which is bonded to the insulating layer 11 typically by performing a molecular adhesion bonding. An oxide layer can possibly be provided on this handle support in order to carry out an oxide-on-oxide type bonding. An embrittlement zone is provided in the handle support, for example by implanting the handle support. Then, a separation of a thickness of the handle support can be carried out at the embrittlement zone, so as to retain another thickness of this support which then forms the surface semiconductor layer 12 (FIG. 12C). Thus, the surface layer 12 can be made using a process of the type commonly referred to as Smart cut™. The semiconductor-on-insulator substrate is then ready to accommodate one or more electronic components as well as at least one RF component or RF circuit.

As an alternative to the exemplary method just described, the junctions can be formed directly in the support layer of a semiconductor-on-insulator substrate, for example using a first implantation to make the doped segment 22 and then a further implantation through the openings of a mask to make the doped regions 23.

A subsequent step of forming conductive tracks 60 of this RF component or RF circuit by making a first metal level is illustrated in FIG. 12. The RF circuit is typically formed on at least two levels of metallization, with one or more conductive tracks of a first level connected to one or more conductive tracks of a second level. The blocking structure formed by PN or NP junctions and as implemented according to the invention can then prevent parasitic currents, likely to be generated by a current flow on each of the metallization levels of the RF circuit, from flowing.

As has been described above, an eddy current blocking structure as implemented according to the invention can be arranged on a semiconductor-on-insulator type substrate, or on a bulk substrate on which an insulating layer is typically added.

Figure 14:
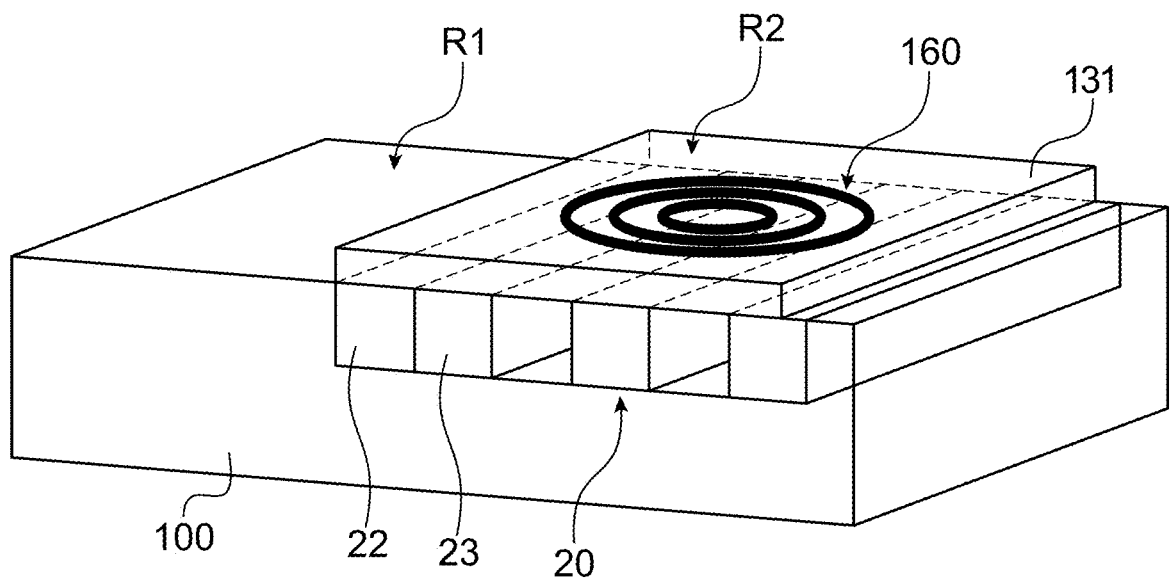
FIG. 14 is used to illustrate a microelectronic device having a substrate with an eddy current blocking structure located in one region, while another region free of BOX is dedicated to a circuit provided with logic components°.

In another exemplary embodiment illustrated in FIG. 14, the doped volume 20 in which the blocking structure is made, is formed in the semiconductor support layer 100 of a substrate and facing a region $R_2$ on which an insulating layer 131 extends, for example of silicon oxide and with a thickness which can be of, for example, between 50 nm and 1 µm. The RF component 160, for example in the form of an antenna, is arranged on this insulating layer 131, while another region $R_1$ of the support layer 100 is, in turn, not covered by the insulating layer 111. This other region $R_2$ can be dedicated to other types of components and/or circuits. For example, logic components can be provided on this other region $R_1$.

The invention claimed is:

1. A substrate for an RF device, the substrate comprising:
a surface semiconductor layer disposed on an insulating layer,
the insulating layer being arranged on a support layer based on semiconductor material,
said support layer being provided with a structure for blocking eddy currents likely to be generated by an RF circuit for being disposed on the substrate,
said blocking structure being formed by a plurality of junctions for blocking flow of eddy currents, said blocking structure comprising,
in a segment doped according to a doping of a first type, in particular P or N, a plurality of distinct doped regions having a doping of a second type opposite to the first type, in particular N or P, said doped regions having a doping of the second type being each entirely surrounded by a zone of said doped segment and with a doping of the first type, and
said regions having a doping of the second type and each making a given pattern formed by at least one first branch and at least one second branch making a non-zero angle with said first branch,
said given pattern being entirely surrounded by said zone of said doped segment and with a doping of the first type,
the given pattern and distribution of said doped regions in said doped segment being provided such that:
in a first direction parallel to the first axis and passing through said structure, said structure comprises one or more first junctions,
in a second direction orthogonal to the first direction and passing through said structure, said structure comprises one or more second junction(s),
in at least a third direction making a non-zero angle with said first and second directions and passing through said structure, said structure comprises one or more third junctions.

2. The substrate according to claim 1, said structure including in said first direction and/or in said second direction and/or in said third direction, a succession of doped regions having a doping of the second type and making said same identical given pattern.

3. The substrate according to claim 1, said distinct doped regions being periodically distributed in said structure on one or more first rows parallel to a first axis.

4. The substrate according to claim 3, wherein said distinct doped regions are periodically distributed in said structure on one or more other rows arranged in parallel to a second axis, said first axis and said second axis being parallel to said main plane, said second axis making a non-zero angle with said first axis.

5. The substrate according to claim 1, wherein said given pattern has a smaller maximum dimension than a predetermined dimension equal to a maximum eddy current propagation length in said semiconductor material of the support layer at an operating frequency of an RF circuit capable of being disposed facing an antenna.

6. The substrate according to claim 1, the first row or rows being formed by a succession of doped regions alternately including said given pattern in a first orientation and said given pattern in a second orientation distinct from the first orientation.

7. The substrate according to claim 6, comprising several other rows in parallel to the second axis, at least one given row being formed by a repetition of said given pattern in the first orientation and at least one neighboring row of the given row being formed by a repetition of said given pattern in the second orientation.

8. The substrate according to claim 1, wherein said distinct doped regions are periodically distributed in said structure in one or more other rows in parallel to a second axis, the first axis and said second axis being axes parallel to said main plane, said second axis making an angle of less than 90° with said first axis, among said first rows at least one given row being formed by a first succession of doped regions replicating said given pattern, at least one neighboring row of said given row being formed by a second succession of doped regions replicating said given pattern, said neighboring row being offset from said given row with respect to a plane orthogonal to the first axis and to said main plane.

9. The substrate according to claim 1, wherein said given pattern comprises a first branch, a second branch at a first end of the first branch and making a non-zero angle with the first branch, and a third branch at a second end of the first branch and making a non-zero angle with the first branch, the second branch and the third branch having respective different orientations in a plane parallel to a main plane of the support layer.

10. The substrate according to claim 9, wherein said given pattern includes a first main branch, a second main branch, a third main branch, a fourth main branch, meeting at an intersection point and secondary branches each located at a respective end of a main branch, the secondary branches having respective different orientations in a plane parallel to a main plane of the support layer.

11. The substrate according to claim 1, wherein said given pattern is a spiral pattern comprising a succession of branches of respective different orientations.

12. A microelectronic device comprising:
a substrate according to one of claim 1,
one or more transistors at least partially formed in the surface layer of said substrate,
at least one RF circuit provided with at least one RF component comprising an antenna or an inductor, said RF component being arranged facing said doped segment.

13. A method for manufacturing a substrate according to claim 1, the method comprising:
performing doping of a first type of at least one segment of a semiconductor support,
disposing a mask facing said doped segment, the mask comprising openings having a shape replicating said given pattern,
implanting regions of said segment doped using a dopant species so as to perfoiin doping of a second type opposite to the first type.

14. The method according to claim 13, comprising after said implantation of regions:
forming an insulating layer on the semiconductor support, and then,
bonding a support provided with a semiconductor layer to the support,
removing a sacrificial portion from the substrate, while the semiconductor layer is retained and forms said surface semiconductor layer.

15. A method for making an RF device according to claim 11, comprising:
providing the surface semiconductor layer disposed on an insulating layer, and then,
forming said RF conductor circuit or RF component facing said doped segment.

16. The substrate according to claim 1, wherein said given pattern has a maximum dimension that is at least twice smaller than a predetermined dimension equal to a maximum eddy current propagation length in said semiconductor material of the support layer at an operating frequency of an RF circuit capable of being disposed facing an antenna.

17. The substrate according to claim 1, wherein said given pattern has a maximum dimension that is at least ten times smaller than a predetermined dimension equal to a maximum eddy current propagation length in said semiconductor material of the support layer at an operating frequency of an RF circuit capable of being disposed facing an antenna.

* * * * *